United States Patent [19]

Akram et al.

[11] Patent Number: 5,578,526
[45] Date of Patent: Nov. 26, 1996

[54] METHOD FOR FORMING A MULTI CHIP MODULE (MCM)

[75] Inventors: Salman Akram, Boise; Warren Farnworth, Nampa; Alan Wood, Boise, all of Id.

[73] Assignee: Micron Technology, Inc., Boise, Id.

[21] Appl. No.: 431,452

[22] Filed: May 1, 1995

Related U.S. Application Data

[63] Continuation-in-part of Ser. No. 847,621, Mar. 6, 1992, Pat. No. 5,440,241.

[51] Int. Cl.$^6$ .................................................. H01L 21/60
[52] U.S. Cl. ........................ 437/209; 437/8; 437/183; 437/215
[58] Field of Search ................... 457/8, 180, 183, 457/186, 189, 209, 214, 215, 216, 218

[56] References Cited

U.S. PATENT DOCUMENTS

| | | | |
|---|---|---|---|
| 4,585,991 | 4/1986 | Reid et al. | 324/158 |
| 4,754,316 | 6/1988 | Reid | 357/68 |
| 4,937,653 | 6/1990 | Blonder et al. | 357/68 |
| 5,177,439 | 1/1993 | Liu et al. | 324/158 |
| 5,323,035 | 6/1994 | Leedy | 257/248 |
| 5,326,428 | 7/1994 | Farnworth et al. | 156/654 |
| 5,440,241 | 8/1995 | King et al. | 324/265 |
| 5,483,741 | 1/1996 | Akram et al. | 437/8 |
| 5,523,697 | 6/1996 | Farnworth et al. | 437/8 |

FOREIGN PATENT DOCUMENTS

WO94/09513  4/1994  WIPO.

*Primary Examiner*—Kevin Picardat
*Attorney, Agent, or Firm*—Stephen A. Gratton

[57] ABSTRACT

A method for forming a multi chip module for singulated semiconductor dice or dice contained on a wafer is provided. The method includes forming an interconnect adapted to support and establish an electrical connection with the dice. The interconnect includes a substrate formed of a material such as silicon with raised contact members. The raised contact members include projections adapted to penetrate contact locations on the dice (e.g., bond pads) to a limited penetration depth to establish the electrical connection. A conductive layer and conductive traces are formed on the substrate to form an electrical path to the contact members. Programmable links, such as fuses or anti-fuses, can be included in the electrical path for enabling or disabling select dice of the module. A packaged multi chip module assembly can be formed by encapsulation of the dice and substrate in an insulating material or by forming a ceramic base and cover.

48 Claims, 11 Drawing Sheets

5,578,526

METHOD FOR FORMING A MULTI CHIP MODULE (MCM)

CROSS REFERENCE TO RELATED APPLICATIONS

This application is a continuation-in-part of application Ser. No. 07/847,621 filed Mar. 6, 1992 now U.S. Pat. No. 5,440,241.

This application is related to application Ser. No. 08/335,267 filed Nov. 7, 1994 now U.S. Pat. No. 5,483,741; application Ser. No. 08/206,747 filed Mar. 4, 1994 now U.S. Pat. No. 5,523,697; co-pending application Ser. No. 08/338,345 filed Nov. 14, 1994; and co-pending application Ser. No. 08/387,687 filed Feb. 13, 1995; all of which are incorporated herein by reference.

FIELD OF THE INVENTION

This invention relates to the manufacture of multi chip modules. Specifically, this invention relates to an improved method for forming multi chip modules and an improved multi chip module that includes an interconnect having a substrate and self limiting contact members.

BACKGROUND OF THE INVENTION

Microelectronic packages called "multi chip modules" (MCMs) are constructed with unpackaged semiconductor dice. With a multi chip module, a number of dice are attached to a printed circuit board or other substrate and electrically connected to form various circuits and electronic devices.

One reason for the increased use of multi chip modules is increased system performance. In particular integrated circuits on multi chip modules can be operated with lower resistance and parasitic capacitances. This is largely a result of decreasing the interconnection length between the dice included in the multi chip module. In addition overall system performance is improved because the input/output ports can be configured to access the whose module, which can be organized to reduce signal delays and access times. The power requirements are also reduced due to a reduction in the driver requirements.

Typically the dice are mounted on a substrate having an interconnect pattern formed using a process such as screen printing. Different techniques are used for mounting the dice to the substrate and for providing interconnection and termination of the unpackaged dice. These techniques include wirebonding, tape automated bonding (TAB), micro-bump bonding and flip chip bonding.

With flip chip bonding, each die is mounted circuit side down, and bond pads on the die are bonded to corresponding connection points on the substrate. Flip chips are formed similarly to conventional dice but require an additional process step to form solder bumps on the bond pads. The solder bumps are typically formed with a height of 25 μm to 75 μm. The solder bumps separate the dice from the substrate and minimize the actual contact between the dice and substrate.

One important consideration in constructing multi chip modules is the electrical connection between the bond pads of the unpackaged dice and the connection points on the substrate. It is important that these electrical connections provide a low resistance or ohmic contact. Additionally, it is preferable that each electrical connection be established with a minimum amount of trauma to the dice and particularly to the bond pads of the dice. The integrated circuits within a die can also be adversely affected if heat or thermal cycling is used to make an electrical connection.

Another important consideration in fabricating multi chip modules is the effect of thermal expansion on the electrical connections. If the dice and substrate expand by a different amount, stress may develop at the connection points and adversely effect the electrical connections. Stresses from thermal expansion can also lead to damage of the dice and substrate. For this reason silicon substrates are often used to construct multi chip modules.

Another problem in the manufacture of multi chip modules is that the size of semiconductor dice and the size and spacing of the bond pads on the dice have become smaller. This makes mounting and interconnecting of the dice on a substrate more difficult. In some electronic devices, such as computers, it is often necessary to integrate a large number of dice into an assembly to provide an extended memory or other component. This compounds the problems outlined above. The present invention recognizes that it is advantageous to construct multi chip modules using fabrication techniques employed in semiconductor manufacture.

OBJECTS OF THE INVENTION

In view of the foregoing, it is an object of the present invention to provide an improved method for forming multi chip modules and an improved multi chip module.

It is another object of the present invention to provide an improved interconnect for multi chip modules.

It is yet another object of the present invention to provide an improved interconnect for multi chip modules having a contact structure with a self limiting silicon tip.

It is a further object of the present invention to provide an improved multi chip module in which dice are densely mounted to reduce the length of the interconnect lines between dice.

Other objects, advantages and capabilities of the present invention will become more apparent as the description proceeds.

SUMMARY OF THE INVENTION

In accordance with the present invention, an improved method for forming a multi chip module and an improved multi chip module are provided. The multi chip module includes an interconnect for mounting one or more singularized dice or dice contained on a semiconductor wafer. The interconnect establishes an electrical connection to the dice and supports the dice or wafer. In addition, the interconnect and dice can be packaged together to provide a packaged assembly.

The interconnect includes a substrate and contact members formed on the substrate. The substrate is formed of a semiconductor material, such as silicon, having a thermal expansion coefficient that matches that of a silicon die. The substrate and contact members are formed using semiconductor fabrication techniques. The contact members are formed in a pattern that matches the size and spacing of contact locations (e.g., bond pads) on the dice. The contact members include one or more projections adapted to penetrate the contact locations on the dice to establish an electrical connection. The projections are formed with a size and shape that permits penetration into the contact locations on the dice but with a self-limiting penetration depth. In an illustrative embodiment, the penetrating projections are formed as elongated blades with a flat tip. The penetrating projections can also be formed as sharpened points and other penetrating shapes.

The contact members and penetrating projections are formed integrally with the interconnect substrate using an etching process or using an oxidation growth process. The contact members are covered with a conductive layer. The conductive layer can be formed as an inert metal, as a stack of metals, as a metal silicide, or as a layer of polysilicon. The conductive layer is in electrical communication with conductive traces formed on a front side of the interconnect which terminate in contact pads along an edge of the interconnect. The contact pads are connectable to bond wires or other electrical connectors, which provide a conductive path to the contact members.

The interconnect can be used to electrically interconnect, or integrate, a large number of dice for use in various applications (e.g., electronics, memory). With such an interconnect each die can be accessed separately through a particular group of contact members. In addition, select contact locations and dice can be included or excluded from an integration using a particular conductive path or programmable links, such as fuses or anti fuses, formed in a conductive path to the contact members.

One advantage of the interconnect is that high temperature processing steps can be used on the interconnect because it is processed separately from the dice or wafer containing the integrated circuitry. Low resistivity materials, such as copper, can be used in forming the interconnect without detriment to the integrated circuits formed on the dice. In addition, the contact members can be formed with a size and density to accommodate a dense arrangement of dice. This permits the multi chip module to be formed with a reduced interconnection length between dice and a high ratio of dice surface area to substrate area.

A method for forming a multi chip module, in accordance with the invention, includes the steps of: forming an interconnect substrate; forming a pattern of contact members on the substrate, the contact members including one or more projections adapted to penetrate contact locations on a semiconductor die to a limited penetration depth; forming an insulating layer (e.g., $SiO_2$, $Si_3N_4$) on the substrate, contact members and projections; forming a conductive layer on the contact members; forming a conductive path on the substrate to the conductive layer; assembling the interconnect with the contact members in permanent mating engagement with contact locations on singulated dice or dice contained on a wafer; and then optionally packaging the interconnect and dice or wafer.

DETAILED DESCRIPTION OF THE PREFERRED EMBODIMENTS

Figure 1A:
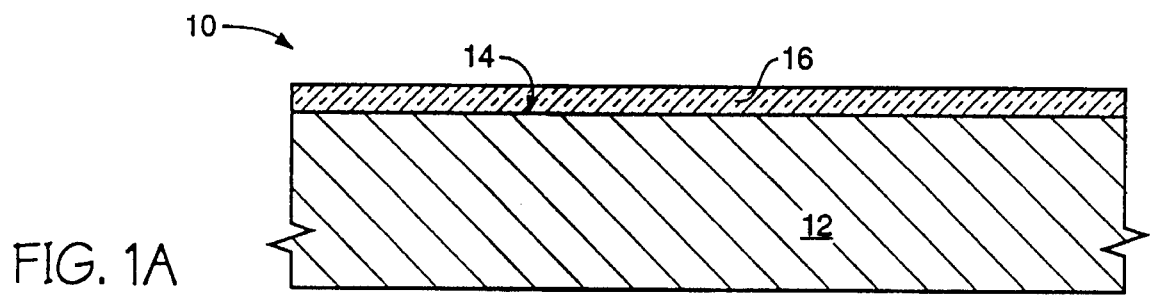
FIG. 1A shows a silicon substrate for the interconnect and a mask layer formed on the substrate.
Figure 1B:
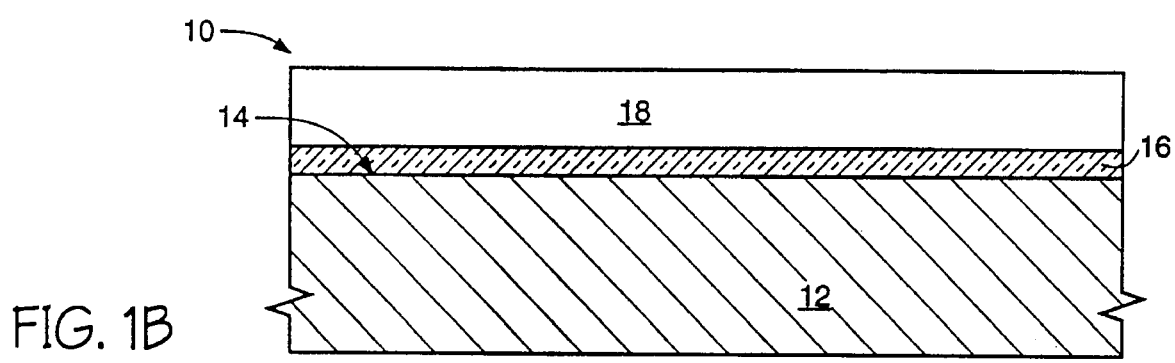
FIG. 1B shows a layer of photoresist deposited on the mask layer.
Figure 1C:
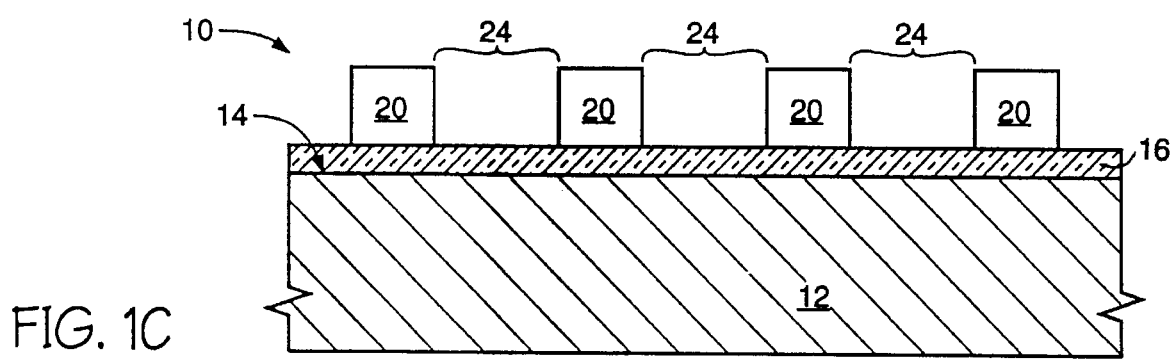
FIG. 1C shows the layer of photoresist after exposure and development.
Figure 1D:
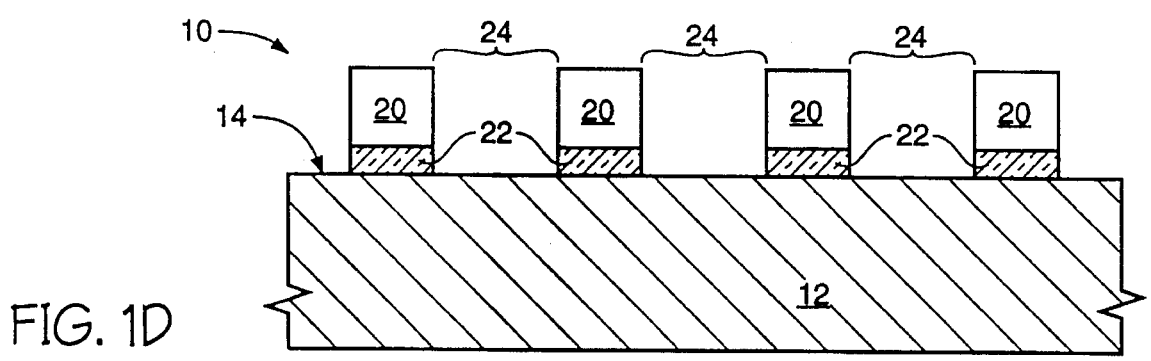
FIG. 1D shows the mask layer after etching using the patterned layer photoresist.
Figure 1E:
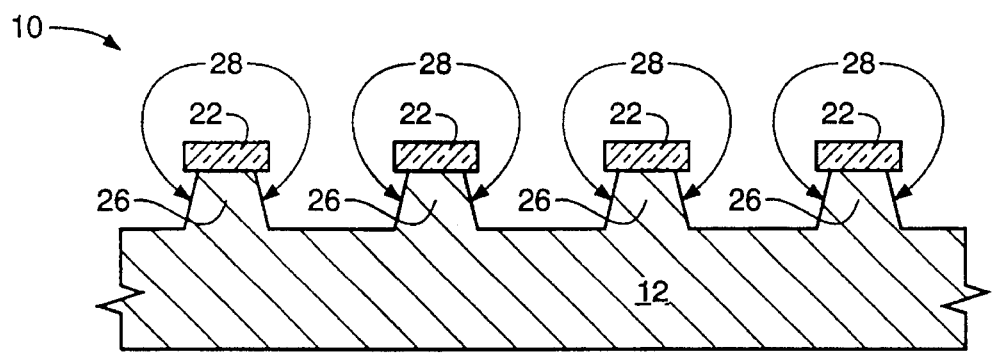
FIG. 1E shows the substrate after etching using the mask layer to form projections having various profiles.
Figures 1, 1E:
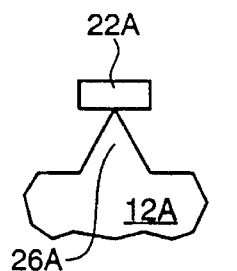
Figures 1, 1E, 2:
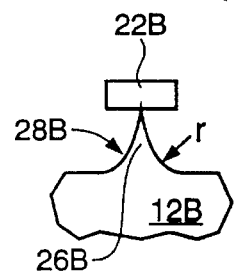
FIG. 2 shows an alternate embodiment interconnect wherein a conductive layer is formed as a metal silicide.
Figures 1, 1E, 2, 3:
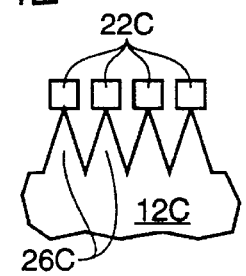
FIG. 3 shows an alternate embodiment interconnect wherein a conductive layer is formed as a bi-metal stack.
Figures 1, 1E, 2, 3, 4:
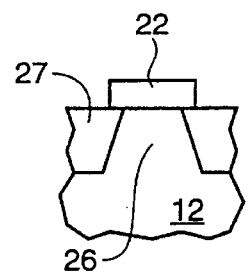
Figure 1F:
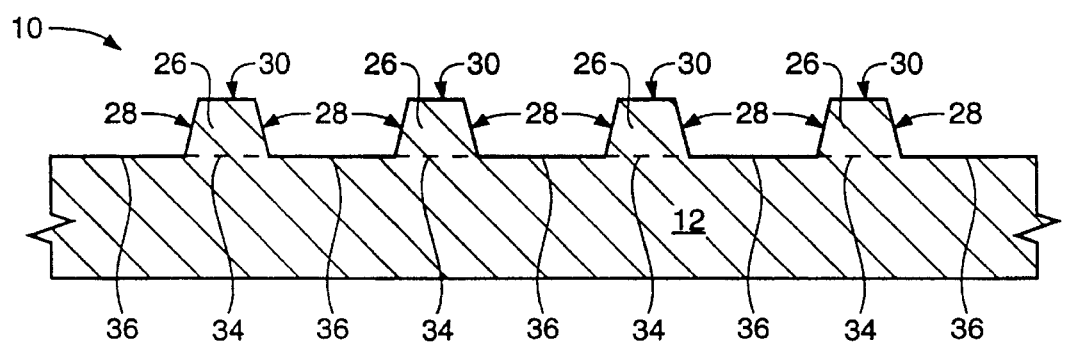
FIG. 1F shows the substrate and projections after stripping of the mask layer.
Figure 1G:
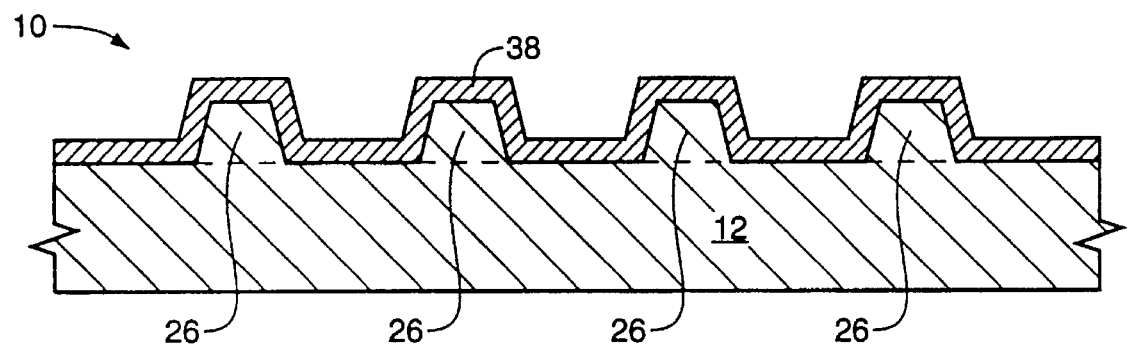
FIG. 1G shows another mask layer formed on the etched substrate.
Figure 1H:
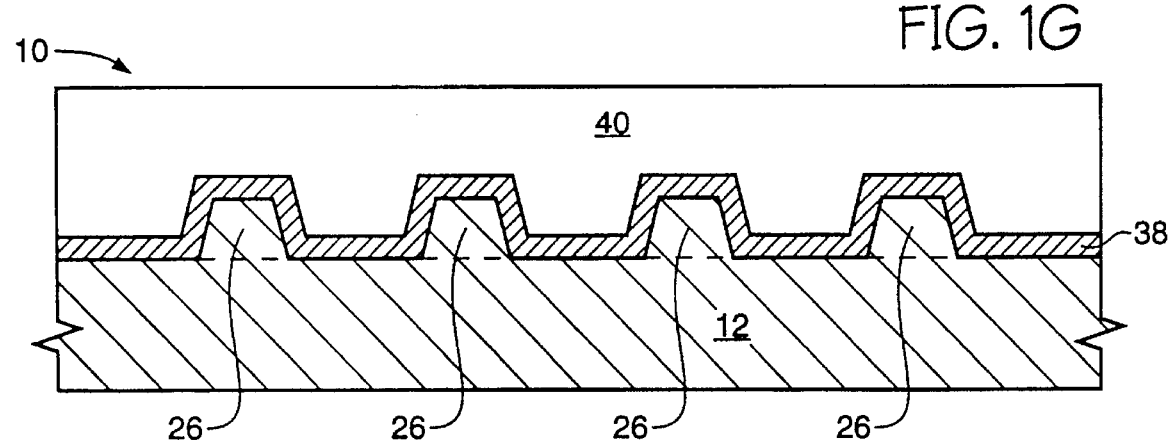
FIG. 1H shows a layer of photoresist formed on the mask layer.
Figure 1I:
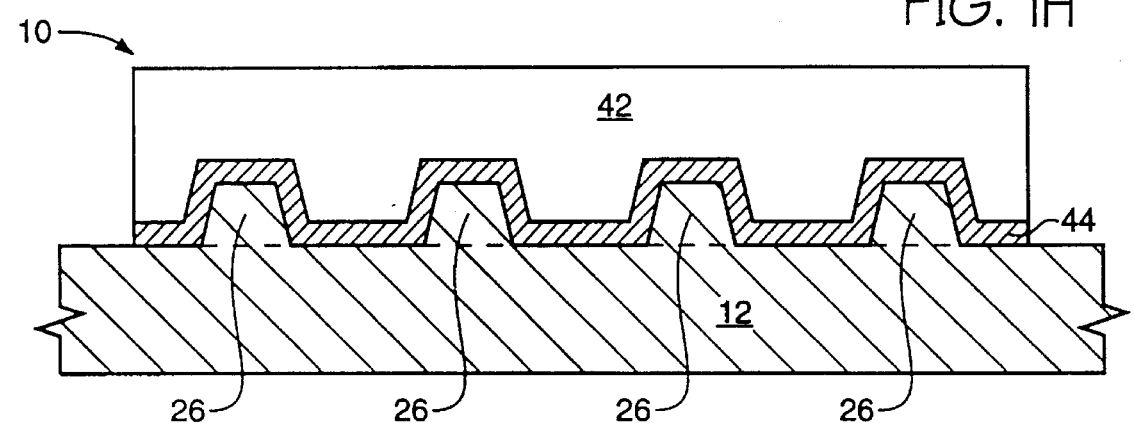
FIG. 1I shows the layer of photoresist and the mask layer after patterning and etching.
Figure 1J:
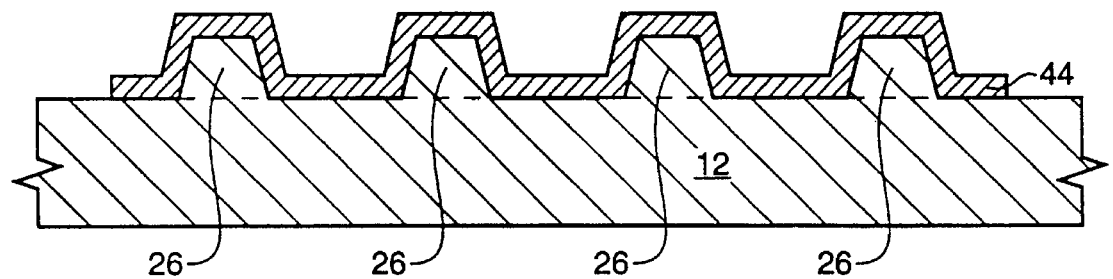
FIG. 1J shows the substrate and mask layer over the projections following removal of the layer of photoresist.
Figure 1K:
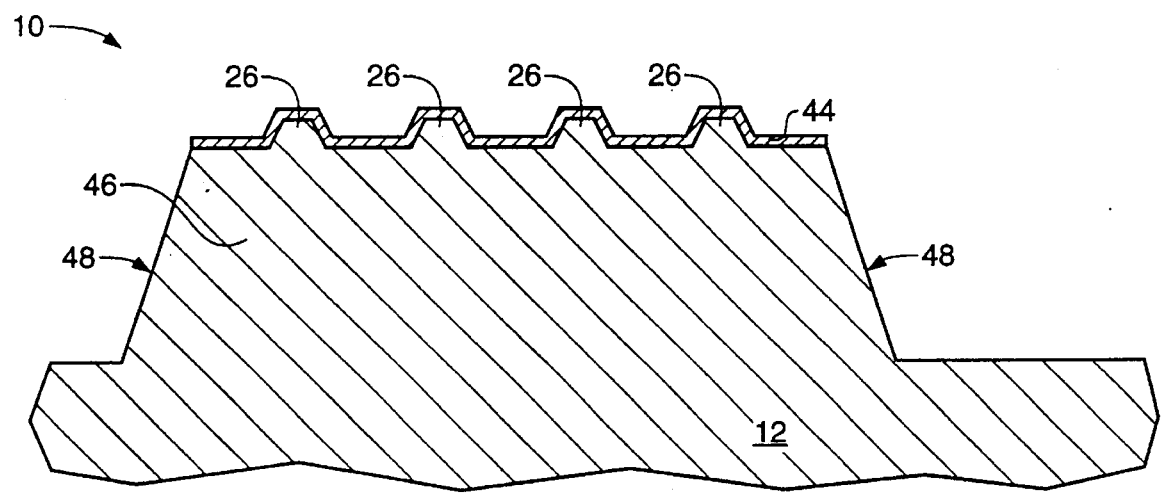
FIG. 1K shows the substrate etched using the mask layer to form a contact member.
Figure 1L:
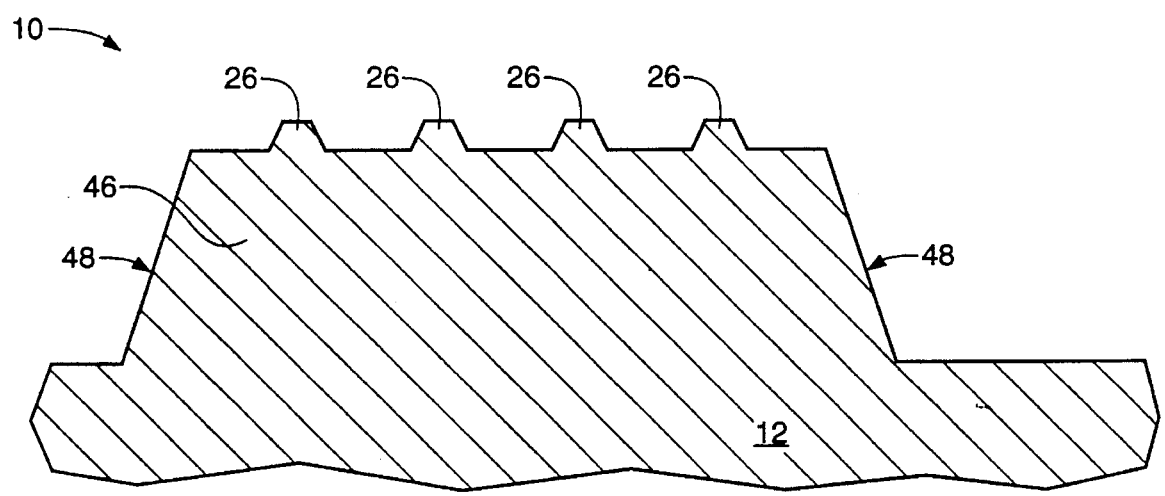
FIG. 1L shows the contact member following removal of the mask layer.
Figure 1M:
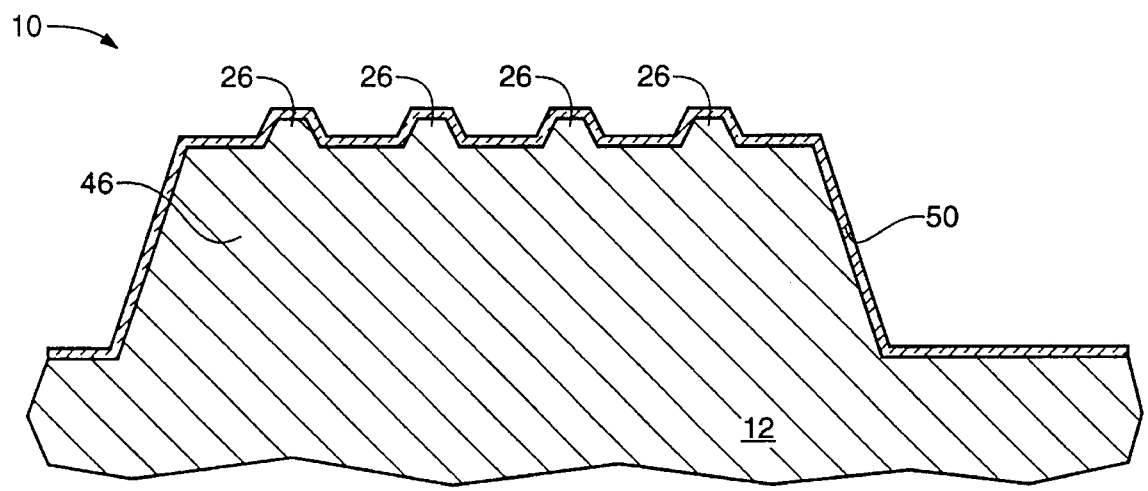
FIG. 1M shows the formation of an insulating layer on the contact member and projection.
Figure 1N:
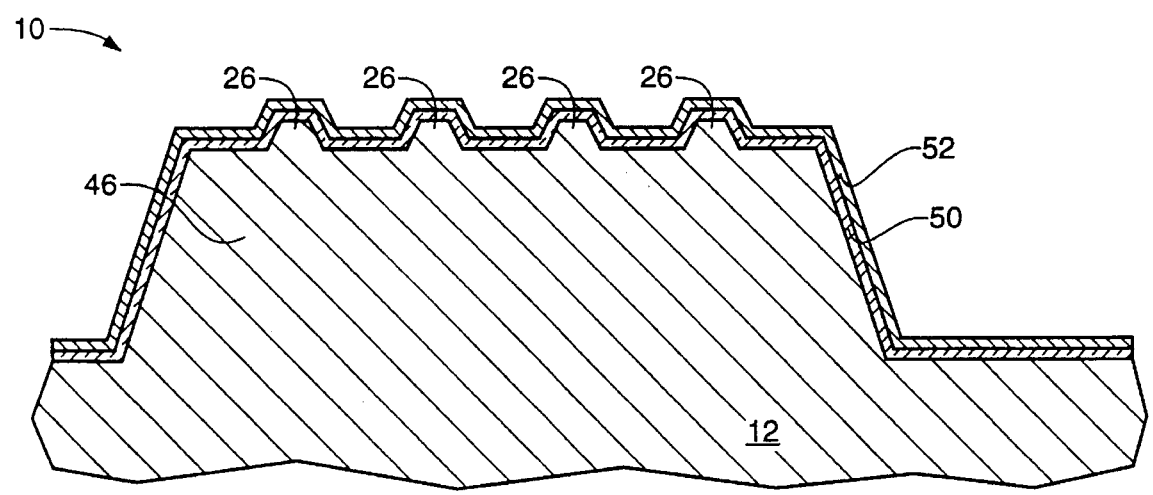
FIG. 1N shows the formation of a conductive layer on the contact member and a conductive trace in electrical communication with the conductive layer.
Figure 2:
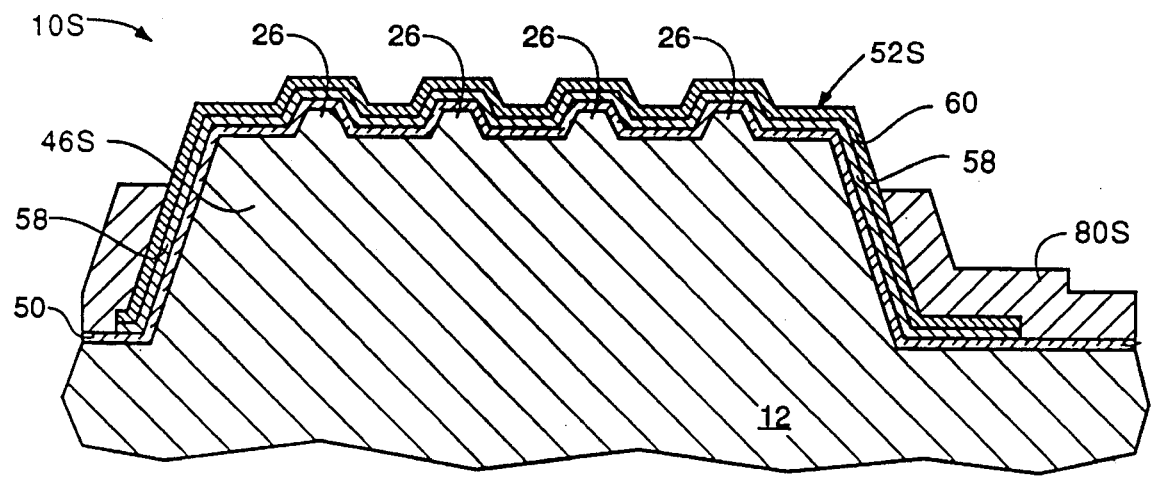
Figure 3:
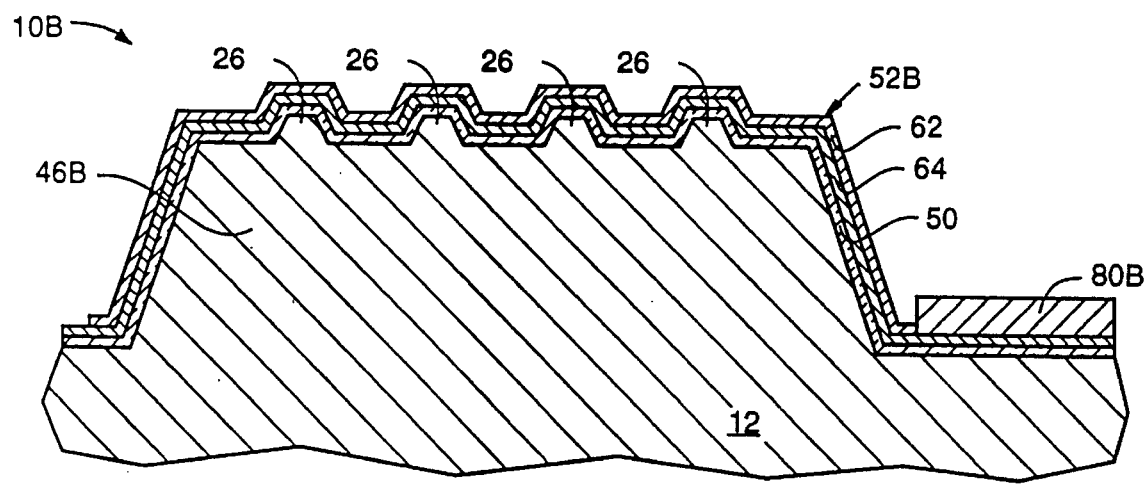

Referring now to FIGS. 1A–1N, a process for forming an interconnect 10 for forming a multi chip module is shown. Initially, as shown in FIG. 1A, a substrate 12 is formed of a material having a thermal expansion coefficient that closely matches that of a silicon die. Suitable materials for the substrate 12 include monocrystalline silicon, silicon-on-glass, silicon-on-sapphire, germanium or ceramic.

The substrate 12 includes a planar outer surface 14. A mask layer 16 is formed on the outer surface 14 of the substrate 12. The mask layer 16 can be formed of a material, such as silicon nitride ($Si_3N_4$), using a suitable deposition process such as CVD. A typical thickness for the mask layer 16 is about 500 Å to 3000 Å.

Next, as shown in FIG. 1B, a layer of photoresist 18 is formed on the mask layer 16. The layer of photoresist 18 can be deposited using a spin-on process and then soft baked to drive out solvents. A typical thickness for the layer of photoresist is about 10,000 Å to 15,000 Å. Following the softbake, the layer of photoresist 18 is aligned with a mask and exposed using collimated UV light.

Next, as shown in FIG. 1C, the layer of photoresist 18 is developed to form a photoresist mask 20. For a positive resist, the development results in the dissolution of the exposed photoresist but does not affect the unexposed regions. For a negative resist, the development results in the dissolution of the unexposed resist.

Next, as shown in FIG. 1D, the mask layer 16 is etched selective to the substrate 12 to form a hard mask that includes masking blocks 22 and openings 24 therebetween. Depending on the materials used for the mask layer 16, this etch step may be performed using a wet or dry etch.

The photoresist mask 20 is removed using a suitable chemical solvent. For a positive resist a solvent such as acetone, methylethylketone or 1-methylethylketone can be used. For a negative resist a solution of concentrated $H_2SO_4$ and $H_2O_2$ at about 150° C. can be used. Such an etch is referred to in the art as a "piranha" etch.

Viewed from above the masking blocks 22 are elongated rectangular blocks formed in a parallel spaced pattern. The peripheral dimensions of the pattern of masking blocks 22 are selected to fall within the peripheral area of a contact location on a semiconductor die. As an example, the contact location on the die can be a polygonal shaped bond pad (e.g., rectangular or triangular shaped pad) that is about 50–100 µm on a side. However, as will be more fully explained, such a parallel spaced pattern of masking blocks 22 is merely exemplary and other patterns or configurations are possible.

Next, as shown in FIG. 1E, penetrating projections 26 are formed on the substrate 12 by etching the exposed substrate 12 between the masking blocks 22. With etching, a dry or wet isotropic, or anisotropic, etch process is used to form the projections 26 as the material under the masking blocks 22 is undercut by the etchant reacting with the substrate 12. In other words, the exposed substrate 12 between the masking blocks 22 etches faster than the covered substrate 12 under the blocks 22.

For a wet anisotropic etch, in which the etch rate is different in different directions, an etchant solution containing a mixture of KOH and $H_2O$ can be utilized. This results in the projections 26 having sidewalls 28 that are sloped at an angle of approximately 54° with the horizontal. The slope of the sidewalls 28 is a function of the different etch rates of monocrystalline silicon along the different crystalline orientations. The surface of the substrate 12 represents the (100) planes of the silicon which etches faster than the sloped sidewalls 28 that represent the (111) plane.

In addition to sloped sidewalls 28, the projections 26 include a flat tip portion 30 (FIG. 1F). The width of the tip portion 30 is determined by the width of the masking blocks 22 and by the parameters of the etch process. As also shown by the lower left hand portion of FIG. 1E, the width of the masking blocks 22A and etch parameters can also be controlled to form projections 26A having a pointed tip.

As also shown in FIG. 1E, a wet isotropic etch can be used to form projections 26B having radiused sidewalls 28B. For an isotropic etch in which the etch rate is the same in all directions, an etchant solution containing a mixture of HF, $HNO_3$ and $H_2O$ can be utilized. This results in projections 26B having a pointed tip and a rounded sidewall contour. In this embodiment the sidewalls 28B of the projections 26B are undercut below the masking blocks 22B with a radius "r". The value of the radius "r" is controlled by the etch parameters (i.e., time, temperature, concentration of etchant) and by the width of the masking blocks 22B.

In addition, FIG. 1E illustrates another embodiment wherein the projections 26C are formed in a saw tooth array with no spaces between the base portions. In this embodiment a wet anisotropic etch is used and the process parameters, including the etch time and width of the masking blocks 22C, are controlled to provide a desired height and tip to tip spacing.

Alternately, in place of an isotropic or anisotropic etch process, the projections can be formed using an oxidizing process. This is also shown in FIG. 1E at the lower right hand corner. With an oxidizing process the substrate 12 may be subjected to an oxidizing atmosphere to oxidize exposed portions of the substrate 12 not covered by the masking blocks 22. As an example, the oxidizing atmosphere may comprise steam and $O_2$ at an elevated temperature (e.g., 950° C.). The oxidizing atmosphere oxidizes the exposed portions of the substrate 12 and forms an oxide layer 27 (e.g., silicon dioxide). When the oxide layer 27 is stripped the resultant structure includes projections 26. With an oxidizing process, the grown oxide layer can be stripped using a suitable wet etchant such as HF.

The projections 26 can also be formed by a deposition process out of a different material than the substrate 12. As an example, a CVD process can be used to form the projections out of a deposited metal.

Following formation of the projections 26, and as shown in FIG. 1F, the masking blocks 22 are stripped. Masking blocks 22 formed of silicon nitride can be stripped using a wet etchant such as $H_3PO_4$ that is selective to the substrate 12. The projections 26 project from a surface 32 of the substrate 12 and include flat tips 30 and bases 34. The bases 34 of adjacent projections 26 are spaced from one another a distance sufficient to define a penetration stop plane 36 there between. The function of the penetration stop plane 36 will be apparent from the continuing discussion. Example spacing between bases 34 would be about 10 µm, while an example length of the projections 26 (i.e., dimension perpendicular to the cross section shown) would be from 3 to 10 µm. The height of each projection 26 is preferably about ⅒ to ½ the thickness of a bond pad on a semiconductor die. The projection 26 will therefore not completely penetrate the full thickness of the bond pad. In addition, this height is selected to allow good electrical contact but at the same time to minimally damage the bond pad. As an example, the height of each projection 26 measured from the top of the substrate 12 to the tip of the projection 26 will be on the order of 2000–5000 Å. This compares to the thickness of a bond pad that is typically on the order of 6000 to 10,000 Å.

Following the formation of the projections 26 and as shown in FIG. 1G, a mask layer 38 is formed on the substrate 12 and projections 26. The mask layer 38 can be formed of a material, such as silicon nitride ($Si_3N_4$), using a suitable deposition process such as CVD. A typical thickness for the mask layer 38 is about 500 Å to 3000 Å.

Next, as shown in FIG. 1H, a layer of photoresist 40 is formed on the mask layer 38. The layer of photoresist 40 is baked, aligned and developed as previously described to form a photomask 42 (FIG. 1I).

Next, as shown in FIG. 1I and 1J, the mask layer 38 is etched and the photomask 42 is stripped to form a hard mask 44. The mask layer 44 is laid out to form contact members that correspond to the placement of contact locations (e.g., bond pads) on a semiconductor die. For a mask layer 38 formed of silicon nitride a dry etch process can be used to etch the mask layer 38 to form the hard mask 44. Suitable dry etchant species include a CL and NF$_3$ mixture. A wet etchant can also be utilized to remove the mask layer 44. The resist photomask 42 can be removed using a piranha etch as previously described.

Next, as shown in FIG. 1K, the substrate 12 is etched around the hard mask 44 to form contact members 46. Typical etching techniques comprise wet anisotropic etching with a mixture of KOH:H$_2$O. This type of etching is also known in the art as bulk micro-machining. With an anisotropic etch the sidewalls 48 of the contact members 46 will be sloped at an angle of about 54° with the horizontal. This forms a the contact member 46, which is generally pyramidally shaped with a truncated tip.

The contact members 46 are sized and shaped to contact a bond pad of a semiconductor die. Each contact member 46 viewed from above has a generally square rectangular peripheral configuration and is dimensioned to fall within the perimeter of a bond pad. The contact members 46 can also be formed in other cross sectional configurations such as triangular, polygonal or circular. The height of each contact member 46 can be varied dependent on the application. One factor is the cleanliness of the environment. The height of the contact member can be selected to provide clearance for particulate contaminates from coming between the die and interconnect. By way of example and not limitation the height of the contact members 46 can be on the order of 0.5–100 μm and the width on each side about 40–80 μm. The spacing of adjacent contact members 46 matches the spacing of adjacent bond pads on a semiconductor die (e.g., 50 to 100 μm).

Next, as shown in FIG. 1L, the hard mask 44 is removed using a wet etch. For a hard mask 44 formed of silicon nitride, an etchant, such as H$_3$PO$_4$, that is selective to the substrate 12 can be used.

Next, as shown in FIG. 1M, an insulating layer 50 is formed on the substrate 12 and over the projections 26 and sidewalls 48 thereof. The insulating layer 50 is formed by oxidation of the substrate 12 and may be accomplished by exposing the substrate 12 to an oxidizing atmosphere in a reaction chamber. Silicon dioxide can also be deposited using CVD. TEOS (tetraethylorthosilane) can be injected into the reaction chamber to grow silicon dioxide (SiO$_2$) at a temperature of about 400° C. A representative thickness for the insulating layer 50 is from about 500 Å to 8000 Å. Another commonly used insulator suitable for this purpose is Si$_3$N$_4$.

Next, as shown in FIG. 1N, a conductive layer 52 is formed on the contact members 46 and over the projections 26. The conductive layer 52 can be formed of a highly conductive metal such as aluminum (Al), copper (Cu) or alloys of these metals. Other suitable metals include the refractory metals, such as titanium (Ti), tungsten (W), tantalum (Ta), platinum (Pt) and molybdenum (Mo). Other suitable metals include cobalt (Co), nickel (Ni), molybdenum (Mo), gold (Au) and iridium (Ir).

The conductive layer 52 can be formed using a metallization process including deposition (e.g., CVD), followed by photopatterning and etching. Conductive traces 80 can also be formed at the same time, of the same metal, and using the same metallization process. Alternately, the metal conductive layer 52 and conductive traces 80 can be formed of different (or the same) metals using separate metallization processes (e.g., CVD deposition, photopatterning, etching). The conductive layer 52 and conductive traces 80 establish an electrical path from the outside world to the bond pads subsequently placed into contact with the contact members 46. This conductive path will come through the input/output ports of the subsequently formed multi chip module.

The photopatterning process for forming the conductive layer 52 and conductive traces 80 can be a standard process in which the photoresist layer is spun on, soft baked and then patterned with UV energy. Electrophoretic deposition processes wherein photoresist formulations are deposited by electrodeposition can also be employed. With such a process, a thin metal layer is blanket deposited on the substrate to be photopatterned and then biased with a potential in an electrolytic bath. The electrolytic bath includes a solution of photoresist formulated to deposit onto the metal layer.

The conductive layer 52 can also be formed of polysilicon. As an example, an LPCVD process can be used to form a conductive layer 52 out of polysilicon doped with phosphorus.

Alternately, as shown in FIG. 2, an interconnect 10S can be formed with a metal silicide conductive layer 52S. The metal silicide conductive layer 52S can be formed by depositing a silicon containing layer 58 (e.g., polysilicon, amorphous silicon) and a metal layer 60, and reacting these layers to form a metal silicide. A typical thickness of the silicon containing layer 58 would be from about 500 Å to 3000 Å.

The metal layer 60 is formed of a metal that will react with the silicon containing layer 58 to form a metal silicide. Suitable metals include the refractory metals, such as titanium (Ti), tungsten (W), tantalum (Ta), platinum (Pt) and molybdenum (Mo). In general, silicides of these metals (WSi$_2$, TaSi$_2$, MoSi$_2$, PtSi$_2$ and TiSi$_2$) are formed by alloying with a silicon surface. Other suitable metals include cobalt (Co), nickel (Ni), molybdenum (Mo), copper (Cu), gold (Au) and iridium (Ir).

Following deposition of the metal layer 60, a sintering process is performed in which the metal layer 60 is heated and reacts with the silicon containing layer 58 to form the metal silicide layer 52S. This type of sintering process is also known in the art as silicide or salicide sintering. Such a sintering step can be performed by heating the silicon containing layer 58 and metal layer 60 to a temperature of about 650° to 820° C. for typical thicknesses in thousands of angstroms (e.g., 2000 Å–3000 Å). This sintering process can be performed in one single step or using multiple temperature steps. The metal silicide layer 52S forms at the interface of the metal layer 60 and the silicon containing layer 58.

The unreacted portions of the metal layer 60 and the silicon containing layer 58 are removed while the metal silicide layer 52S is left intact. This can be done by etching the metal layer 60 and silicon containing layer 58 selective to the metal silicide layer 52S. By way of example, for a TiSi$_2$ silicide layer, the unreacted titanium can be removed with a wet etchant such as a solution of ammonia and hydrogen peroxide, or a H$_2$SO$_4$/H$_2$O$_2$ mixture, that will attack the metal layer 60 and not the metal silicide layer 52S. Alternately, a dry etch process with an etchant species such as Cl$_2$ or BCl$_3$ can be used to etch the metal layer 60 selective to the metal silicide layer 52S.

For etching the unreacted portion of the silicon containing layer 58 selective to the metal silicide layer 52S, a wet etchant such as an HF:HNO$_3$:H$_2$O acid mixture (typical ratios of 1:10:10) can be used to remove the unreacted silicon. A wet isotropic etchant can also be used for this purpose. Alternately, the silicon containing layer 58 can be etched selective to the metal silicide layer 52S using a dry etch process and an etchant such as $NF_3$ at low pressures (typically 30 m torr) or $CL_2$ and HBr at 130 m torr.

Following formation of the metal silicide layer 52S, the resistivity of the metal silicide layer 52S can be lowered using an annealing process. This can be accomplished by heating the substrate 10 and metal silicide layer 52S to a temperature of between about 780° C. to 850° C. for several minutes. Conductive traces 80S are formed in contact with the metal silicide layer 52S using a suitable deposition process. Co-pending application Ser. No. (92-680.1) incorporated herein by reference describes such a metal silicide layer 52S in greater detail.

Alternately, as shown in FIG. 3, an interconnect 10B can be formed with a bi-metal conductive layer 52B. The bi-metal conductive layer 52B includes a barrier layer 62 and a bonding layer 64. The barrier layer 62 is formulated to prevent formation of an oxide layer that would change the resistivity of the contact structure 46B and prevent the formation of an ohmic contact. In addition, the barrier layer 62 is formulated to prevent reaction of the bonding layer 64 with the contact location on the die. By way of example, the barrier layer 62 can be formed of a metal such as platinum (Pt) or titanium (Ti). The bonding layer 64 is formulated to provide a good mechanical bond with conductive traces 80B that are subsequently formed on the substrate 12. By way of example, the bonding layer 64 can be formed of aluminum (Al), tungsten (W) or titanium (Ti).

Figure 4A:
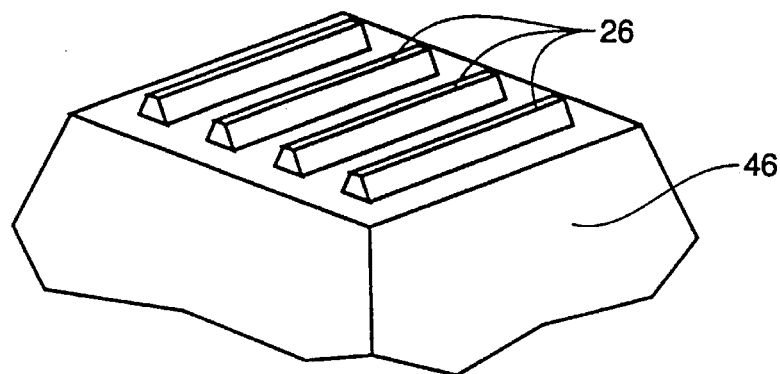
FIG. 4A is a perspective view of a contact member formed in accordance with the invention with an arrangement of projections.
Figure 4B:
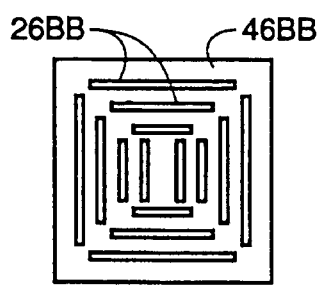
FIGS. 4B–4F are plan views illustrating various other pattern arrangements for the projections.
Figure 4C:
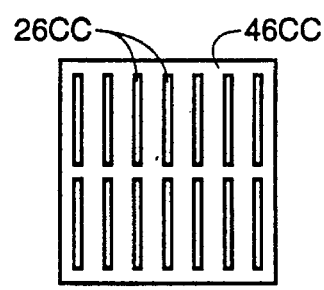
Figure 4D:
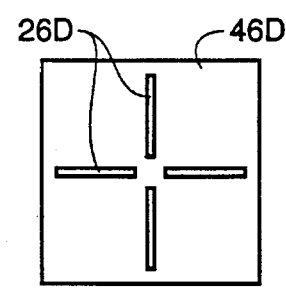
Figure 4E:
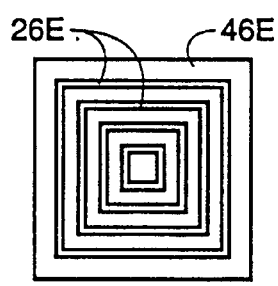
Figure 4F:
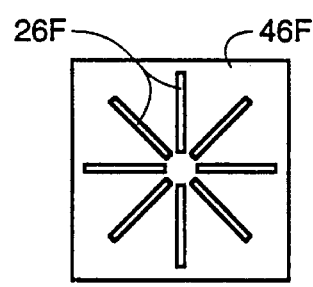

FIGS. 4A–4F illustrate exemplary patterns for the projections 26 formed on the raised contact members 46. FIG. 4A shows the pattern of projections 26 formed by the process of FIGS. 1A–1N. In FIG. 4A, the projections 26 are formed on the contact member 46 in a parallel spaced array. In FIG. 4B the projections 26BB are formed on the contact member 46B in pattern of discontinuous nested squares. In FIG. 4C the projections 26CC are formed on the contact member 46C in two rows. In FIG. 4D the projections 26D are formed on the contact member 46D in a cross pattern. In FIG. 4E the projections 26E are formed on the contact member 46E as enclosed nested squares. In FIG. 4F the projections 26F are formed on the contact member 46F in a spoke-like pattern.

Figure 5:
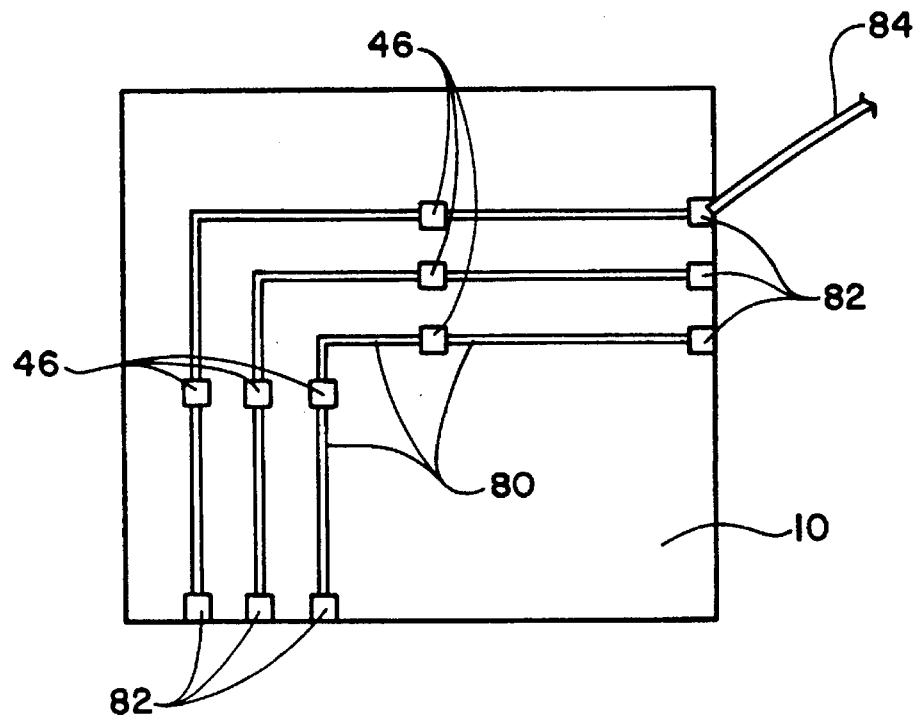
FIG. 5 is a schematic perspective view of a completed interconnect formed in accordance with the invention.

Referring now to FIG. 5, an overview of a completed interconnect 10 is shown. As shown in FIG. 5, the conductive traces 80 are formed in a desired pattern dependent on a pattern of contact locations and on particular circuit requirements for interconnecting a plurality of semiconductor dice. The conductive traces 80 terminate at a peripheral edge of the substrate 12 and are formed with bonding sites 82. These bonding sites 82 act as the input/output ports for the subsequently formed multi chip module. The bonding sites 82 can be used to attach bond wires 84 to complete the conductive path to the contact members 46. The bond wires 84 can be attached to the bonding sites 82 using a wire bonding process. Alternately other electrical connectors, such as slide contacts or clips (mechanical connector 84M-FIG. 7), can be placed in electrical contact with the bonding sites 82 to complete a conductive path from the contact members 46 to external circuitry.

At the completion of the fabrication process for the interconnect 10 a protective layer (not shown) can be deposited over the surface of the interconnect. Such a protective layer would be similar in function to a passivation layer formed on a semiconductor die. The protective layer can be formed of a material such as polyimide or an oxide. The protective layer would not cover the tip of the contact members 46 nor the projections 26 to enable electrical connection to be made to the bond pads on the dice. The protective layer can be deposited and patterned using standard photolithography techniques.

Figure 6:
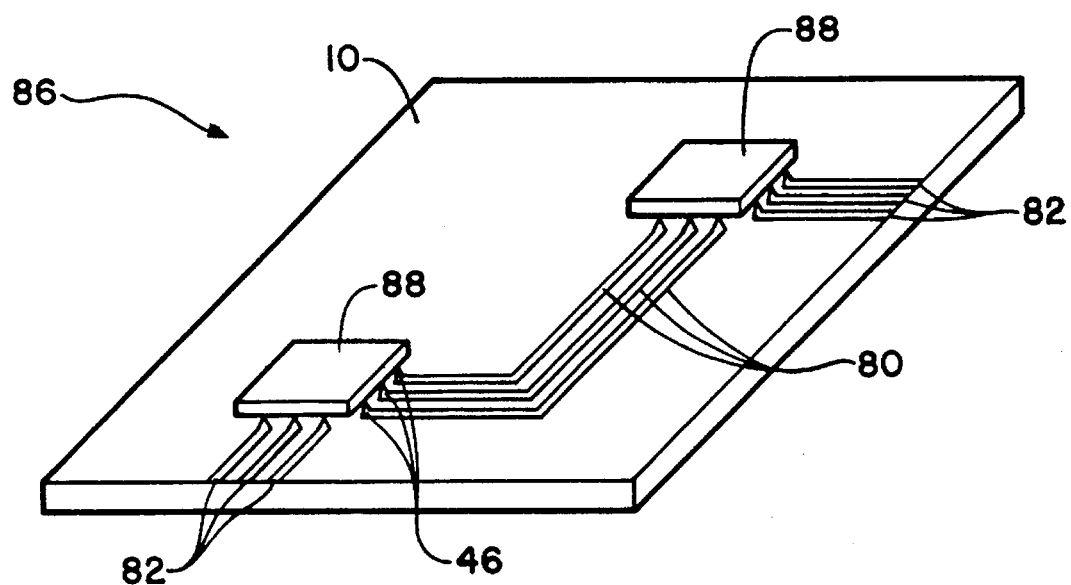
FIG. 6 is a schematic perspective view, with parts removed, showing a multi chip module formed in accordance with the invention and including an interconnect and singularized dice attached to the interconnect.

Referring now to FIG. 6, a multi chip module 86 formed using the interconnect 10 is shown. The multi chip module 86 includes one or more singulated semiconductor dice 88 mounted on the substrate 12 in electrical communication with the contact members 46. The dice 88 can be attached to the substrate 12 using a suitable adhesive. Additionally, as will be more fully explained, the dice 88 and substrate 12 can be bonded using additional process steps (e.g., metal bonding, forming an insulating material in spaces between dice 88 and substrate 12). The dice 88 are arranged in a particular circuit configuration specific to the intended use for the multi chip module 86. For example, for a memory application, one or more dice 88 can be configured on the interconnect 10 to function as a microprocessor and one or more dice 10 can be configured to function as a memory cache.

During assembly, the dice 88 are placed on the substrate 12 in a flip chip mode (i.e., circuit side down). Alignment techniques that have been developed in flip chip bonding can be utilized to align the contact members 46 on the substrate 12 with the contact locations on each die 88. By way of example, U.S. Pat. No. 4,899,921 to Bendat et al. describes flip chip alignment techniques using an aligner bonder tool. Additionally, a suitable alignment technique is described in co-pending related application Ser. No. 08/338,345.

Figure 7:
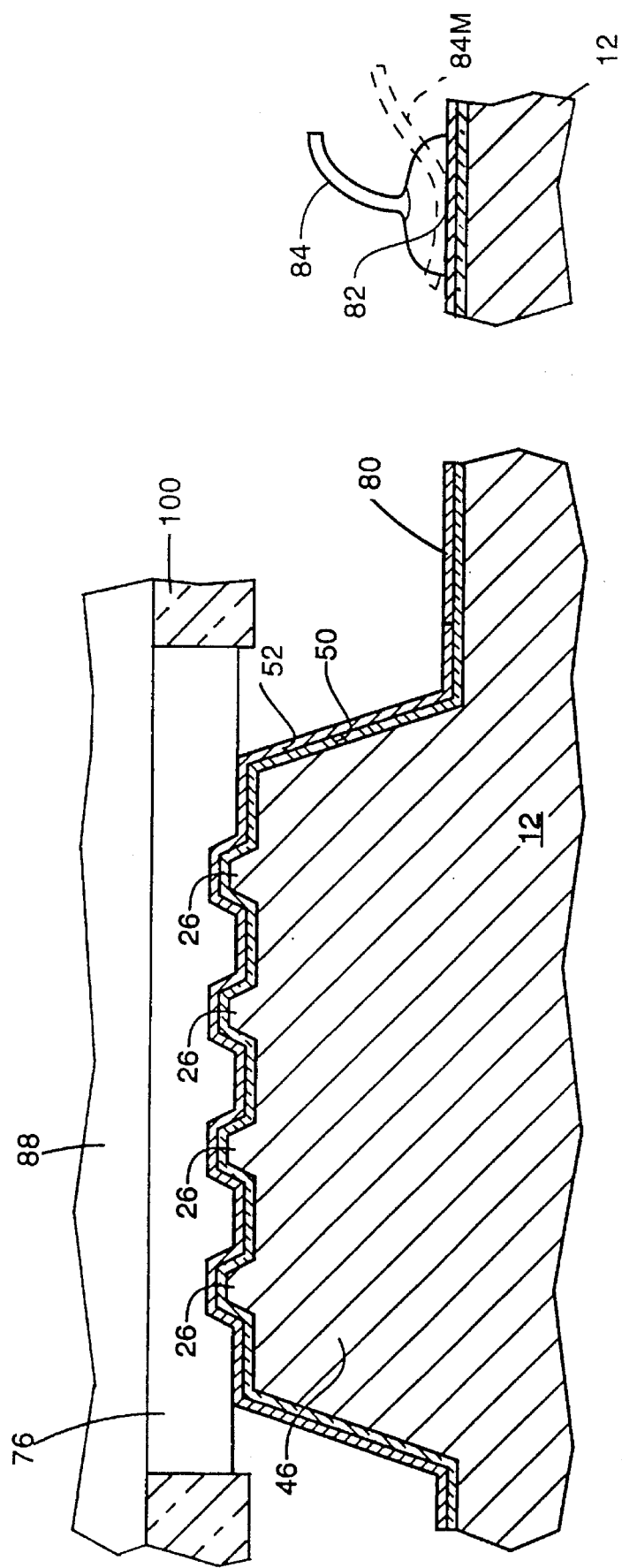
FIG. 7 is an enlarged cross sectional view showing engagement of a contact member on the interconnect with a bond pad on a die.

With reference to FIG. 7, following alignment each die 88 is biased into contact with its respective contact members 46. During assembly a predetermined force can be applied to each die 88 such that the projections 26 of contact members 46 penetrate the contact locations on the die 88. In the illustrative embodiment, the contact locations on the die 88 are flat metal bond pads 76 embedded in a passivation layer 100. For establishing an electrical connection with the bond pad 76, the projections 26 of the contact member 46 penetrate into the bond pad 76 and pierces any native oxide present on the bond pad 76. However, the penetration depth of the projections 26 is limited by the stop plane 36 formed on the top surface of the contact member 46. Optimally, the projections 26 penetrate about half way through the thickness of the bond pad 76. This provides a low resistance electrical connection between the conductive layer 52 covering the contact members 46 and projections 26 and the bond pad 76 on the die 88. As previously stated, the conductive layer 52 is in electrical communication with the circuit traces 80 formed on the substrate 12. Bond wire 84 or mechanical connectors 84M complete a circuit path to external circuitry.

The contact members 46 and conductive layer 52 in addition to establishing an electrical connection can also be processed to mechanically bond the dice 88 to the substrate 12. As an example, a conductive layer 52 formed of one material (e.g., Al), will bond mechanically to a bond pad 76 formed of the same material (Al). For this purpose heat or ultrasonic energy can also be used to mechanically bond the conductive layer 52 to the bond pads 76.

With the contact members 46 in contact with the bond pads 76, a space is provided between the die 88 and substrate 12 which is approximately equal to the height of the contact members 46. This helps to prevent particle damage to the die 88. In addition, it eliminates the need to provide die with bumped bond pads although bumped die could be used.

Following attachment of the dice 88 to the substrate 12, an electrically insulating material can be applied to the dice 88 and substrate 12. By way of example, an encapsulation process using a curable material such as polyimide or silicone gel can be used to encapsulate the dice 88 and substrate 12 to provide a packaged assembly. A plastic enclosure or casing can also be utilized to package the dice 88 and substrate 12.

Figure 8:
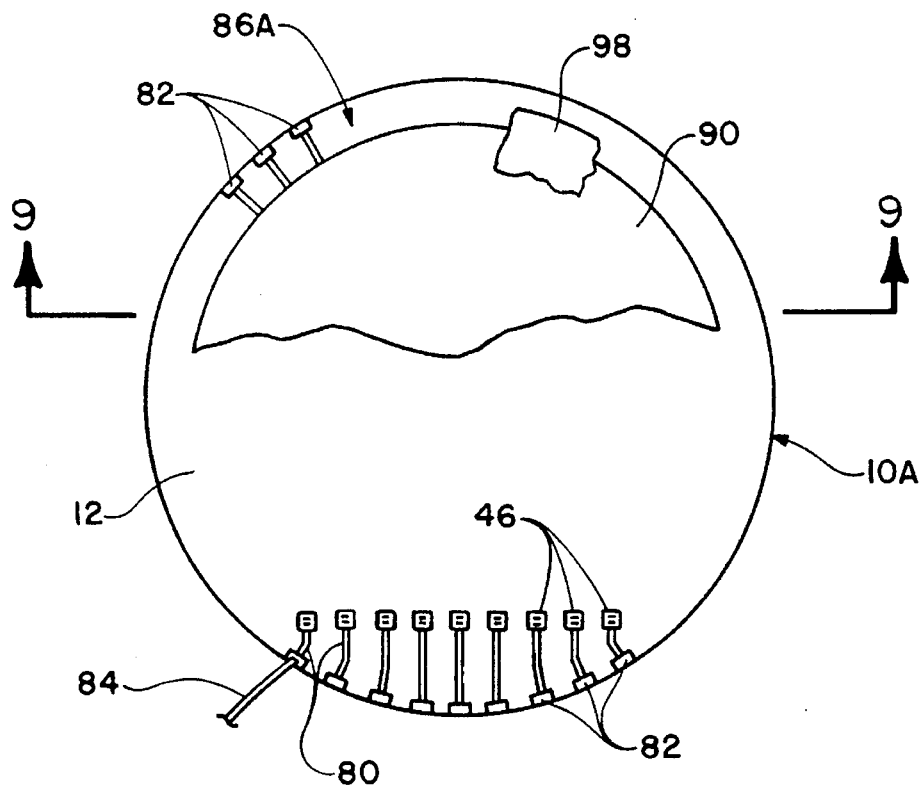
FIG. 8 is a plan view showing a multi chip module formed with a complete semiconductor wafer.
Figure 9:
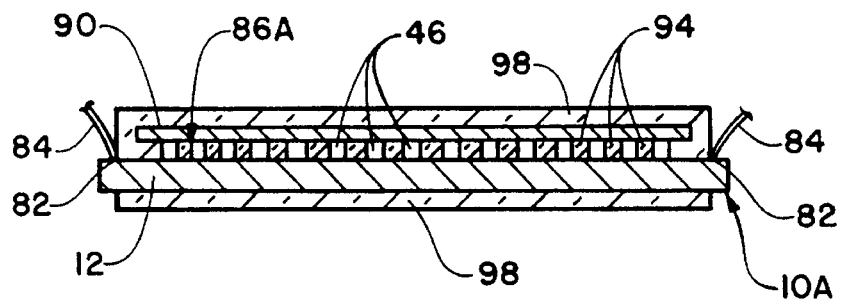
FIG. 9 is a cross sectional view taken along section line 9—9 of FIG. 8.

With reference to FIGS. 8 and 9, a multi chip module 86A formed with a complete semiconductor wafer 90 rather than singulated dice is shown. As shown in FIG. 8, the interconnect 10A is formed in a circular peripheral configuration that matches the circular peripheral configuration of a semiconductor wafer 90. Preferably the diameter of the interconnect 10A is slightly larger than the diameter of the wafer 90 to allow access for the bond wires 84. The contact members 46 are formed in a pattern, or geometrical configuration, that matches a pattern of contact locations (e.g., bond pads) on the wafer 90. By way of example, a wafer 90 can include seventy or more dice, each having seventy or more contact locations. A mating interconnect 10A will thus include two thousand one hundred contact members 46. As is apparent, however, the interconnect 10A can include a greater or lesser number of contact members 46 as required.

The wafer 90 and interconnect 10A can be aligned using optical alignment techniques developed for flip chip bonding as previously described. After the interconnect 10A and wafer 90 are assembled in mating engagement, the interconnect 10A and wafer 90 can be packaged in a casing 98. The casing 98 can be formed by applying a curable electrically insulating material such as polyimide, or a potting material. Packaging can also be facilitated using a mold formed in a desired shape. The casing 98 protects and insulates the interconnect 10A and wafer 90 and provides the normal force necessary for maintaining the interconnect 10A and wafer 90 in electrical contact. Additionally, an adhesive material (not shown) can be applied at the interface of the interconnect 10A and wafer 90.

Prior to the packaging process, however, it can be beneficial to form an insulating material such as an oxide layer or polyimide polymers over the exposed portions of the assembled interconnect 10A and wafer 90. This fills in the space between the interconnect 10A and wafer 90 and bonds the wafer 90 and interconnect 10A. Preferably such an insulator formation process can be performed at a temperature less than 300° C. For an interconnect 10A and wafer 90 formed of silicon, this can be accomplished using a low temperature plasma enhanced chemical vapor deposition process (PECVD). The plasma enhanced deposition process can include $O_2$ and a silicon containing species such as silane (silicon tetrahydride-$SiH_4$) or TEOS (tetraethylorthosilicate).

During the deposition process a grown oxide 94 (FIG. 9) forms on all of the exposed silicon surfaces such as in the space between the wafer 90 and interconnect 10A. The deposited oxide 94 can be on the order of 5 μm to 10 μm in thickness. This deposition process further helps to bond the interconnect 10A and wafer 90 together and to maintain the mechanical bond therebetween. In addition, the oxide helps to further insulate exposed surfaces of the packaged assembly. Such an oxidation growth process can also be used to bond the interconnect 10 and singulated dice 88 shown in FIG. 6.

Figure 10:
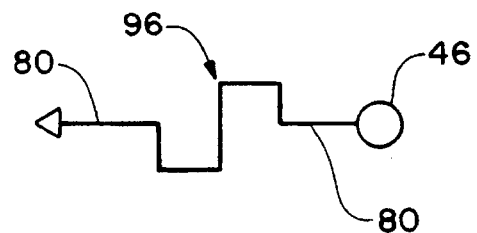
FIG. 10 is an electrical schematic illustrating a programmable link in a conductive path to the contact tips.

Referring now to FIG. 10, another aspect of the present invention is illustrated. A programmable link 96 can be placed in the electrical path to the contact members 46 in order to permit selective address of the contact locations on the die 88 or wafer 90. The programmable link 96 can be conveniently placed in the conductive trace 80 for each contact member 46. The programmable link 96 can be formed as a fuse, as an anti-fuse or as a laser programmable link. Fuses are well known in the art and are programmed to blow upon input of a predetermined current. Anti-fuses are adapted to provide an electrical connection upon application of a predetermined voltage. A laser programmable link is adapted to break upon application of a laser beam (i.e., laser break-link programming). With a programmable link 96, select contact locations or dice 88 can be enabled or disabled as required and thus included or excluded from an integration of dice. The programmable links are particularly useful in the full wafer embodiment shown in FIG. 8, as non functional dice can be isolated by activation of the link (e.g., blowing a fuse).

Figure 11:
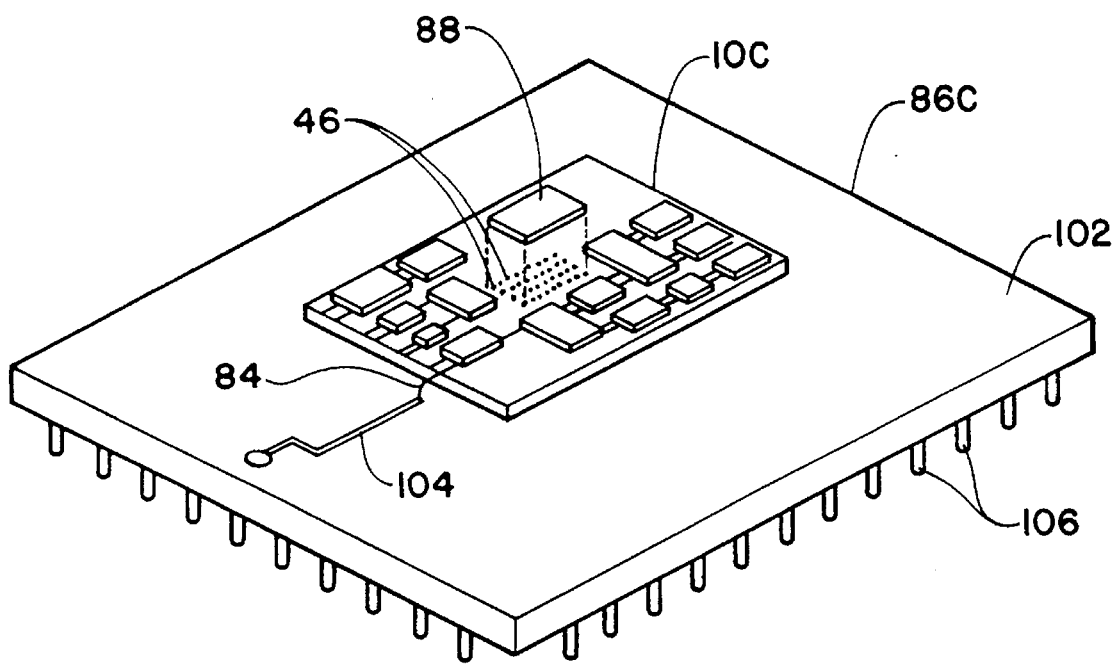
FIG. 11 is an exploded perspective view, with parts removed, of a multi chip module formed in accordance with the invention and including a ceramic base.
Figure 12:
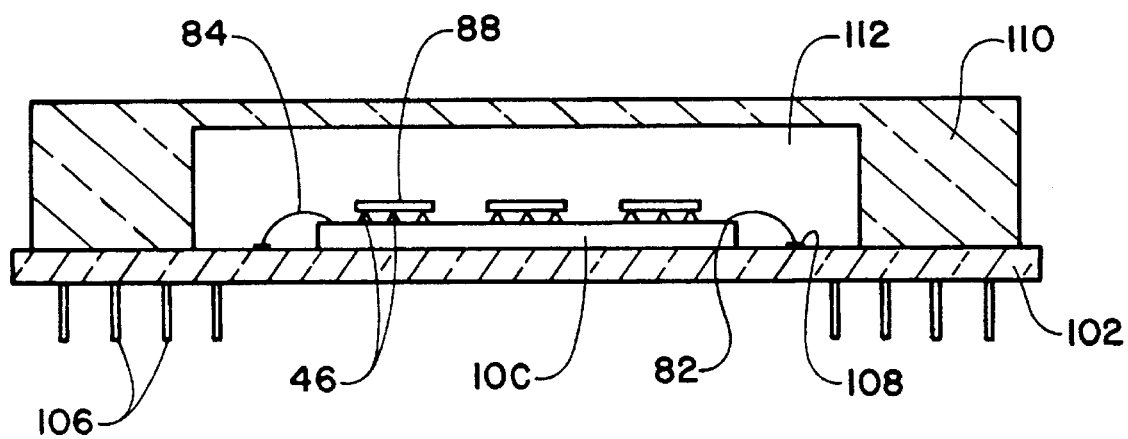
FIG. 12 is a schematic cross sectional view of the multi chip module shown in FIG. 11.

Referring now to FIGS. 11 and 12 another packaging arrangement for a multi chip module 86C formed in accordance with the invention is shown. The multi chip module 86C includes an interconnect 10C formed as previously described. The interconnect 10C includes a plurality of contact members 46 with a plurality of semiconductor dice 88 mounted thereon as previously described. The interconnect 10C is mounted on a ceramic base 102. The ceramic base 102 includes circuit traces 104 in electrical communication with electrical pins 106 of a pin grid array.

The bonding sites 82 (FIG. 12) on the interconnect 10C are wire bonded to corresponding bonding sites 108 (FIG. 12) on the ceramic base 102 in electrical communication with the circuit traces 104 on the ceramic base 102. This establishes a conductive path from the electrical pins 106 of the ceramic base 102 to the contact members 46 on the interconnect 10C and to the bond pads 76 (FIG. 7) on the dice 88.

As shown in FIG. 12, the packaged multi chip module 86C also includes a cover 110 attached to the ceramic base 102. The cover 110 is formed of an electrically insulating material, such as plastic, that can be adhesively or otherwise attached to the ceramic base 102. The cover 110 is shaped to form a space 112 for housing the interconnect 10C and dice 88. The space 88 can be filled with an electrically insulating material such as silicone gel. Such a silicone gel in addition to being insulating, also helps to prevent particulate contamination from lodging within the multi chip module 86C.

Thus the present invention provides an improved multi chip module and a method for forming a multi chip module using an interconnect having self limiting contact members. The interconnect can be used to form a multi chip module with singularized dice or dice contained on a wafer. The interconnect provides a pattern of closely spaced contact members for establishing an electrical connection to the dice. Furthermore, the interconnect can be subjected to high temperature processing steps because the interconnect itself does not contain integrated circuitry.

Although the method of the invention has been described with reference to certain preferred embodiments, as will be apparent to those skilled in the art, certain changes and modifications can be made without departing from the scope of the invention as defined by the following claims.

What is claimed:

1. A method for forming a multi chip module comprising:

forming a substrate;

forming contact members on the substrate for establishing an electrical connection with contact locations on a semiconductor die, said contact members formed with projections for penetrating the contact locations on the die to a limited penetration depth;

forming a conductive layer on the contact members and projections;

forming an electrical path on the substrate to the conductive layer for each contact member; and attaching the die to the substrate with the contact locations on the die in contact with the contact members on the substrate.

2. The method as claimed in claim 1 and wherein the die is contained on a semiconductor wafer.

3. The method as claimed in claim 1 and wherein the die is a singulated die.

4. The method as claimed in claim 1 and further comprising bonding the conductive layer on the contact member to the contact locations on the die.

5. The method as claimed in claim 1 and further comprising forming the conductive layer of a material that can be bonded to the contact locations on the die.

6. The method as claimed in claim 1 and further comprising forming a material in a space between the die and substrate said material selected from the group consisting of oxides and insulating materials.

7. The method as claimed in claim 1 and wherein the substrate is formed of a material selected from the group consisting of silicon, silicon-on-sapphire, silicon-on-glass, germanium and ceramic.

8. The method as claimed in claim 1 and wherein the contact members and substrate are formed of a same material.

9. The method as claimed in claim 1 and wherein the conductive layer on the contact members is formed of a material selected from the group consisting of metal, metal silicides and polysilicon.

10. The method as claimed in claim 1 and further comprising forming a programmable link in the electrical path to selectively enable or disable select contact locations.

11. The method as-claimed in claim 1 and wherein the conductive layer on the contact members is formed as a stack of metals.

12. The method as claimed in claim 1 and wherein the electrical path includes conductive traces formed on a surface of the substrate using a metallization process.

13. The method as claimed in claim 1 and further comprising following formation of the conductive layer, forming a protective layer on the substrate except on the contact members.

14. A method for forming a multi chip module comprising:

providing a semiconductor die;

forming a substrate;

forming contact members on the substrate for establishing an electrical connection with contact locations on the die, said contact members formed as raised members having projections adapted to penetrate the contact locations on the die to a limited penetration depth;

forming an insulating layer on the contact members;

forming a conductive layer on the insulating layer;

forming an electrical path on the substrate to the conductive layer for each contact member;

placing the contact members and contact locations on the die in contact;

packaging the substrate and die in an electrically insulating package.

15. The method as claimed in claim 14 and wherein the electrically insulating package includes a base.

16. The method as claimed in claim 14 and wherein the electrically insulating package includes a ceramic base, a cover and a gel formed in a space between the ceramic base and cover.

17. The method as claimed in claim 14 and further comprising forming an insulating layer on the substrate and die after they are placed in contact.

18. The method as claimed in claim 14 and wherein the electrically insulating package includes a base and an encapsulating plastic material.

19. The method as claimed in claim 14 and further comprising forming programmable links in the conductive path and using the programmable links to enable or disable select contact locations.

20. The method as claimed in claim 14 and wherein the projections are formed as elongated blades.

21. The method as claimed in claim 14 and wherein the projections are formed as sharp points.

22. The method as claimed in claim 14 and wherein the projections are formed with a flat tip.

23. A method for forming a multi chip module, comprising:

providing a semiconductor die having a contact location in electrical communication with integrated circuits;

forming a substrate;

forming a raised contact member on the substrate for contacting the contact location;

forming a projection on the contact member dimensioned to penetrate the contact location to a limited penetration depth;

forming an insulating layer on the contact member and projections;

forming a conductive layer on the insulating layer;

forming conductive traces on the substrate to the conductive layer;

attaching the die to the substrate; and bonding the contact member and contact location together.

24. The method as claimed in claim 23 and wherein the substrate and contact member are formed of silicon.

25. The method as claimed in claim 23 and wherein the conductive trace includes a programmable link for selectively enabling or disabling the contact location.

26. The method as claimed in claim 23 and further comprising packaging the substrate and die together on a base.

27. The method as claimed in claim 26 and wherein the base is formed of a ceramic.

28. The method as claimed in claim 27 and further comprising forming a cover over the ceramic base.

29. The method as claimed in claim 28 and further comprising filling a space between the cover and the ceramic substrate with a silicone gel.

30. The method as claimed in claim 23 and wherein the projection is formed by forming a mask on the substrate and etching the substrate using the mask.

31. The method as claimed in claim 30 and wherein etching is with an anisotropic etch to form the projection with sloped sidewalls.

32. The method as claimed in claim 30 and wherein a width of the etch mask is controlled to form the projection with a flat tip portion.

33. The method as claimed in claim 30 and wherein etching is with an isotropic etch to form the projection with radiused sidewalls.

34. The method as claimed in claim 30 and wherein etching is controlled to form a plurality of projections in a saw tooth configuration.

35. The method as claimed in claim 23 and wherein the projection is formed by forming a mask on the substrate, depositing an insulating material using the mask and then removing the mask.

36. The method as claimed in claim 23 and wherein the projection is formed by forming a first mask on the substrate and etching the substrate, and the contact member is formed by forming a second mask over the projection and substrate and etching the substrate.

37. A method for forming a multi chip module comprising:

providing a plurality of semiconductor dice each having a plurality of contact locations in electrical communication with integrated circuits;

forming a substrate;

forming a first mask on the substrate and etching the substrate to form a plurality of projections;

forming a second mask on the projections and substrate and etching the substrate to form a plurality of raised contact members with projections, said contact members formed in a pattern for contacting the contact locations on the dice, said projections adapted to penetrate the contact locations on the dice to a limited penetration depth;

forming an insulating layer on the contact members and projections;

forming a conductive layer on the insulating layer;

forming conductive traces on the substrate to the conductive layer for each contact member; and attaching the dice to the contact members.

38. The method as claimed in claim 37 and further comprising packaging the substrate and dice on a base.

39. The method as claimed in claim 37 and wherein the dice are contained on a semiconductor wafer.

40. The method as claimed in claim 37 and wherein the dice are singulated dice and are attached to the contact members using an adhesive.

41. The method as claimed in claim 37 and further comprising forming programmable links in the conductive traces and selectively enabling or disabling select contact locations using the progreumnable links.

42. The method as claimed in claim 41 and wherein the programmable links are selected from the class consisting of fuses, anti-fuses and laser programmable links.

43. The method as claimed in claim 37 and wherein the substrate is formed of a material having a thermal expansion coefficient that matches a thermal expansion coefficient of the dice.

44. The method as claimed in claim 37 and wherein the substrate is formed of a material selected from the group consisting of silicon, silicon-on-sapphire, silicon-on-glass, germanium, and ceramic.

45. The method as claimed in claim 37 and further comprising bonding the dice to the contact member by depositing an insulating material on the substrate and dice.

46. The method as claimed in claim 37 and further comprising forming the conductive layer and contact locations of a material that enables formation of a mechanical bond.

47. The method as claimed in claim 37 and wherein the projections are formed with a height of from 2000–8000 Å.

48. The method as claimed in claim 37 and wherein the contact members are formed with a height of from 2–100 μm.

* * * * *

UNITED STATES PATENT AND TRADEMARK OFFICE
CERTIFICATE OF CORRECTION

PATENT NO. : 5,578,526
DATED : November 26, 1996
INVENTOR(S) : Salman Akram, Warren Farnworth, Alan Wood It is certified that error appears in the above-identified patent and that said Letters Patent is hereby corrected as shown below:

Column 3, line 61 after layer add --of--.

Column 3, line 63 add --Figures 1E-1 to 1E-4 illustrate alternate embodiments for the projections;--

Column 5, lines 56-57 delete "As also shown by the lower left hand portion of FIG. 1E" and substitute --As shown in FIG. 1E-1 --.

Column 5, line 60 delete "As also shown in FIG. 1E," and substitute --As shown in FIG. 1E-2,--.

Column 6, line 4 delete "1E" and substitute --1E-3 --.

Column 6, line 13 delete "also".

UNITED STATES PATENT AND TRADEMARK OFFICE
CERTIFICATE OF CORRECTION

PATENT NO. : 5,578,526
DATED : November 26, 1996
INVENTOR(S) : Salman Akram, Warren Farnworth, Alan Wood Page 2 of 2

It is certified that error appears in the above-identified patent and that said Letters Patent is hereby corrected as shown below:

Column 6, line 13 delete "1E" and substitute --1E-4.--

Column 6, lines 13-14 delete "at the lower right hand corner."

Column 9, line 10 delete "(92-680.1)" and substitute --08,387,687 previously--.

Column 13, line 59 change "member" to --members--.

Column 13, line 61 after "contact" add --and--.

Column 14, line 30 change "projections" to --projection--.

Signed and Sealed this

Eighteenth Day of March, 1997

Attest:

BRUCE LEHMAN

*Attesting Officer*  *Commissioner of Patents and Trademarks*